United States Patent
Wagner

(10) Patent No.: US 9,543,173 B2
(45) Date of Patent: *Jan. 10, 2017

(54) DECAPSULATOR WITH APPLIED VOLTAGE AND ETCHANT COOLING SYSTEM FOR ETCHING PLASTIC-ENCAPSULATED DEVICES

(71) Applicant: Nisene Technology Group, Watsonville, CA (US)

(72) Inventor: Alan M. Wagner, Watsonville, CA (US)

(73) Assignee: Nisene Technology Group, Watsonville, CA (US)

( * ) Notice: Subject to any disclaimer, the term of this patent is extended or adjusted under 35 U.S.C. 154(b) by 751 days.

This patent is subject to a terminal disclaimer.

(21) Appl. No.: 13/896,207

(22) Filed: May 16, 2013

(65) Prior Publication Data

US 2014/0342572 A1    Nov. 20, 2014

(51) Int. Cl.
*H01L 21/67* (2006.01)
*H01L 21/311* (2006.01)
*H01L 21/56* (2006.01)

(52) U.S. Cl.
CPC ... *H01L 21/67126* (2013.01); *H01L 21/31133* (2013.01); *H01L 21/56* (2013.01); *H01L 21/6708* (2013.01)

(58) Field of Classification Search
None
See application file for complete search history.

(56) References Cited

U.S. PATENT DOCUMENTS

| 4,344,809 | A | * | 8/1982 | Wensink ........... H01L 21/67126 |
|           |   |   |        | 134/151 |
| 4,474,621 | A |   | 10/1984 | Saccocio et al. |
| 5,131,852 | A | * | 7/1992 | Grabbe ............ H01L 23/49861 |
|           |   |   |        | 257/E23.066 |
| 5,766,496 | A |   | 6/1998 | Martin |
| 5,792,305 | A |   | 8/1998 | Winsemius et al. |
| 5,855,727 | A |   | 1/1999 | Martin et al. |
| 6,350,110 | B1 |   | 2/2002 | Martin |

(Continued)

OTHER PUBLICATIONS

Author Unknown, RKD Engineering, FA Products, Elite Etch Model 7100, Dual Acid Decapsulation System for Copper Technology, Copyright 2011, printed on Jul. 9, 2013.

*Primary Examiner* — Karla Moore
*Assistant Examiner* — Margaret D Klunk
(74) *Attorney, Agent, or Firm* — Van Pelt, Yi & James LLP

(57) ABSTRACT

An apparatus and a method for selectively etching an encapsulant forming a package of resinous material around an electronic device includes an electronic device package mountable on the etch head; a conductive electrode in electrical contact with package leads of the electronic device package to apply a first voltage to the package leads of the electronic device; a first pump configured to pump a first quantity of the etchant solution from the source into the etch head where the etchant solution is electrically biased to a second voltage different from the first voltage and is cooled to a temperature below the ambient temperature. An etch cavity is formed on an exterior surface of the electronic device package. When the etchant solution has etched through an exterior surface of the electronic device package, the conductive bond wires of the electronic device is prevented from being etched by the applied first voltage.

11 Claims, 4 Drawing Sheets

(56) References Cited

U.S. PATENT DOCUMENTS

| | | |
|---|---|---|
| 6,723,656 B2 | 4/2004 | Martin |
| 7,981,698 B2 | 7/2011 | Pryputniewicz et al. |
| 8,945,343 B2 * | 2/2015 | Wagner .................... C25F 3/00 156/345.18 |
| 9,059,184 B2 | 6/2015 | Martin |
| 2001/0029060 A1 * | 10/2001 | Fukada ................. B81B 3/0005 438/50 |
| 2003/0006137 A1 * | 1/2003 | Wei .......................... B23H 9/16 204/280 |
| 2005/0106879 A1 * | 5/2005 | Krywanczyk ........... H01L 21/78 438/690 |
| 2013/0082031 A1 | 4/2013 | Wagner |
| 2013/0157471 A1 * | 6/2013 | Martin .................... H01L 21/56 438/745 |

* cited by examiner

DECAPSULATOR WITH APPLIED VOLTAGE AND ETCHANT COOLING SYSTEM FOR ETCHING PLASTIC-ENCAPSULATED DEVICES

BACKGROUND OF THE INVENTION

Electronic devices with integrated circuit chips encapsulated in plastic packaging have been employed for some years. Typically, an epoxy resin is molded around the chip, a central portion of a lead frame and bonding wires or other connections between contact pads on the chip to inner lead fingers on the lead frame. It is sometimes necessary to decapsulate such as plastic-encapsulated package at least in part to allow for inspection, test and repair of the chip or the wire bonds to the chip, or the inner lead fingers, after the epoxy covering these elements is safely and effectively removed. In general, concentrated acids such as sulfuric and nitric acids or other solvents for the resin have been used in a decapsulation system for removing plastic material to expose the encapsulated chip or package elements.

U.S. Pat. No. 5,766,496 describes a decapsulation system for selectively etching an encapsulant of a plastic-encapsulated package. U.S. Pat. No. 6,350,110 B1 describes a multi-port metering pump which can be incorporated in a decapsulation system to deliver a very small volume of liquid to the etch head. A suitable decapsulation system should be capable of providing control of the amount of etching, preventing damage to the chip or package elements, and providing safety of use.

BRIEF DESCRIPTION OF THE DRAWINGS

Various embodiments of the invention are disclosed in the following detailed description and the accompanying drawings.

DETAILED DESCRIPTION

Figure 1:
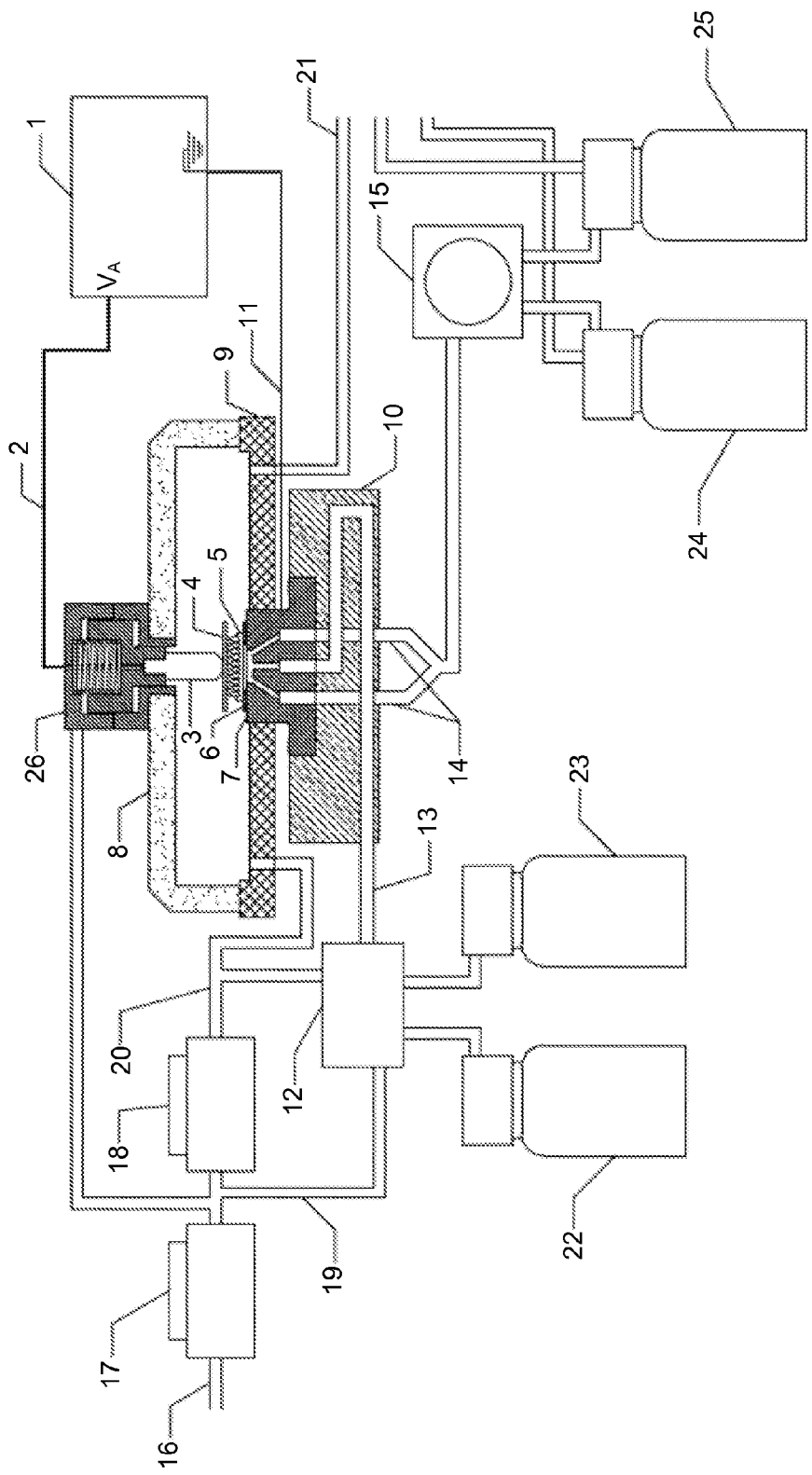
FIG. 1 is a schematic side view of a decapsulation system according to one embodiment of the present invention.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a decapsulation system and method applies a bias voltage to a plastic encapsulated electronic device under etch. The applied voltage has the effect of protecting the conductive bond wires of the electronic device from damages during the etch process. In embodiments of the present invention, the decapsulation system and method is applied to plastic encapsulated electronic devices constructed using conductive bond wires made of materials other than gold. Furthermore, in some embodiments, the decapsulation system incorporates an etchant cooling system to facilitate cooling of the etchant or etchant mixture to a temperature below the ambient temperature. In this manner, the decapsulation system and method performs decapsulation of plastic encapsulated electronic devices using an applied voltage and cooled etchant or etchant mixture.

In the present description, an electronic device refers to a packaged semiconductor device incorporating one or more integrated circuit chips. Although an electronic device may be packaged in a variety of ways using different types of encapsulation materials, the present description is concerned with electronic devices that are encapsulated in plastic packaging or other types of resinous materials. That is, the electronic device includes plastic encapsulation covering at least the chip(s), a central portion of a lead frame and bond wires connecting the chip(s) to the lead frame. Bond wires are made of various conductive materials, with copper bond wires and gold bond wires being most commonly used. The electronic device also includes leads or lead fingers projecting out of the plastic encapsulation where the leads or lead fingers are used to form electrical connections from the outside world to the integrated circuit chips encapsulated therein.

In embodiments of the present invention, the basic structure of the decapsulation system is constructed based on the decapsulation system described in aforementioned U.S. Pat. No. 5,766,496 and may incorporate the multi-port metering pump described in U.S. Pat. No. 6,350,110 B1. However, the decapsulation system of the present invention incorporates enhancements over the aforementioned decapsulation systems by providing an applied voltage to the electronic device under etch. The decapsulation system and method in accordance with embodiments of the present invention will be described with reference to FIGS. 1 and 2.

Figure 2:
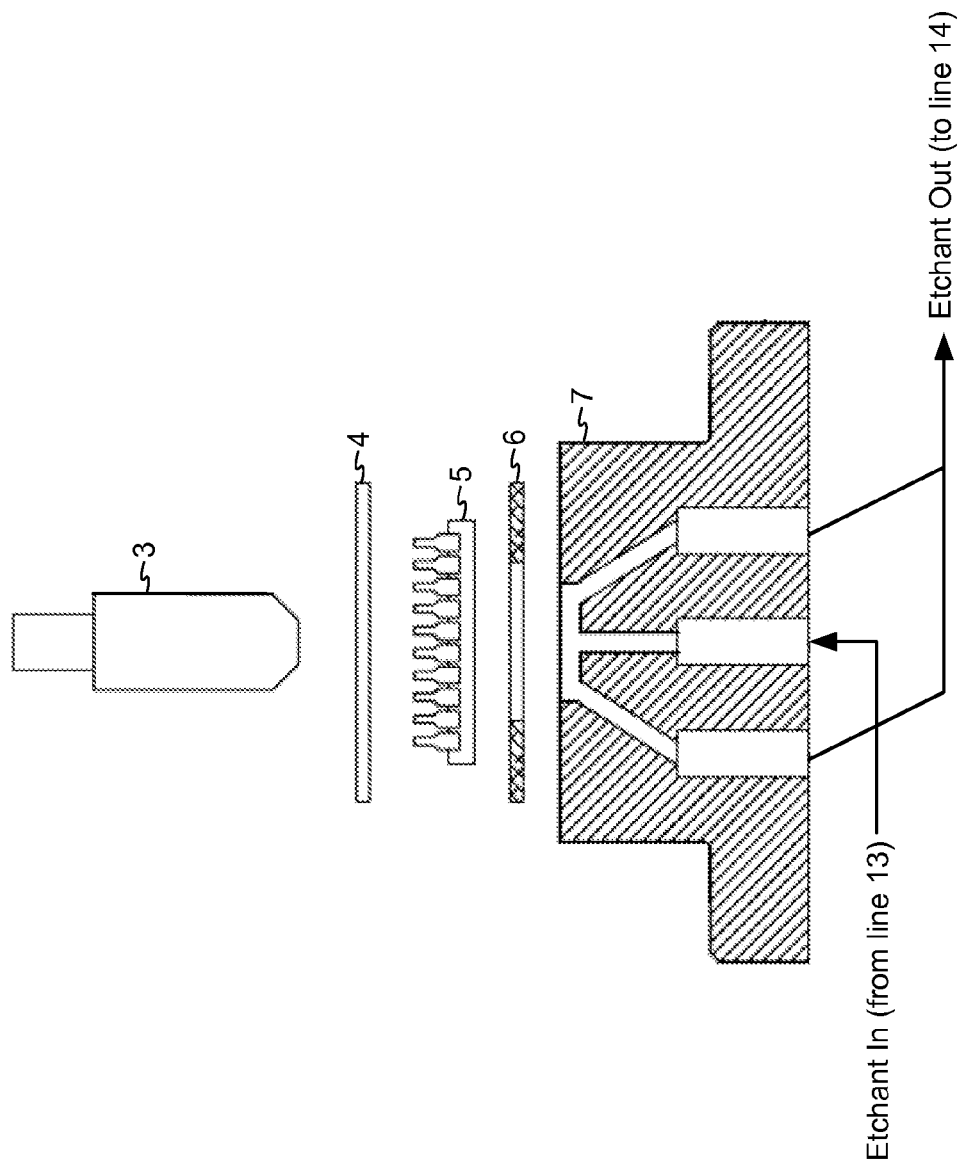
FIG. 2 is an exploded side view of the etch head portion of the decapsulation system of FIG. 1.

FIG. 1 is a schematic side view of a decapsulation system according to one embodiment of the present invention. FIG. 2 is an exploded side view of the etch head portion of the decapsulation system of FIG. 1. Referring to FIGS. 1 and 2, a micro-metering multi-port pump 12 draws an etchant mixture from two etchant supply bottles 22, 23 and pumps the etchant mixture into an etchant supply line 13. The pump 12 is actuated by dry nitrogen at high pressure (e.g. ~70 PSI). The pressure is controlled by a high-pressure regulator 17 receiving a source of dry nitrogen on a dry nitrogen supply line 16.

As the etchant mixture is pumped through the etchant supply line 13, the etchant mixture travels through the spirally passageway in the core of a heat exchanger 10. The heat exchanger 10 adjusts the temperature of the etchant mixture to a desired etching temperature. In some embodiments, the heat exchanger 10 may also adjust the temperature of the etch head 7 and, through a gasket 6 that defines the decapsulation aperture, the plastic encapsulated electronic device 5 to be etched (henceforth referred to as the "sample") to the etching temperature. In embodiments of the present invention, the heat exchanger 10 may be operated to heat or cool the etchant mixture. That is, the heat exchanger 10 may be operated to increase or decrease the etching temperature of the etchant mixture, such as to increase above or decrease below the ambient temperature. Furthermore, the heat exchanger 10 may be operated to heat or cool the etch head and at least the surface of the device under etch mounted on the etch head.

The conductive leads protruding from the sample's encapsulant are pressed up against a metal backing plate 4. This combination of sample 5 and the metal backing plate 4 is held in place over the etch head 7 and the aperture-defining gasket 6 by a metal ram-nose 3. The metal ram-nose 3 is connected to a moveable safety cover 8 and a cover-arm assembly 26.

When high pressure is applied to the cover-arm assembly 26 through a high-pressure supply line 19 from the high-pressure regulator 17, the safety cover 8 presses down on an etch plate 9, forming the etch chamber. Meanwhile, the ram-nose 3 presses down on the metal backing plate 4, creating a seal between the sample 5 and the etch head 7 through the gasket 6. Also, the etch chamber is pressurized with low-pressure nitrogen (e.g. ~5 PSI) by a low-pressure supply line 20 from a low-pressure regulator 18. The low-pressure nitrogen in the etch chamber vents to an etch chamber vent line 21.

In embodiments of the present invention, the metal ram-nose 3 is supplied with a voltage from an adjustable power supply 1. More specifically, the metal ram-nose 3 is connected to a positive node 2 of the power supply 1 providing a voltage $V_A$. While etching, voltage $V_A$ travels through the ram-nose 3 to the metal backing plate 4 to the sample 5, which provides the bond wires of the device under etch 5 with a positive electrical bias. Meanwhile, the etch head 7 is connected through a wire to the negative terminal 11 of the adjustable power supply 1. The negative terminal of the power supply 1 can be connected to a negative voltage potential but is typically at ground. The etch head 7 is thus electrically biased to the ground potential. Accordingly, the etchant mixture is electrically biased to the ground potential as well. In the present embodiment, the etch head 7 is grounded to bias the etchant mixture to the ground potential. In other embodiments, other methods to apply ground potential to the etchant mixtures may be used, such as by use of a conductive electrode coated with a non-conductive material.

As the etchant mixture is pumped through the heat exchanger 10 and the etch head 7, the etchant mixture contacts the sample 5 through the gasket 6 and etches a cavity in the encapsulant of the sample. The etched encapsulant and waste acid leave the etch chamber through an etchant waste line 14 and are collected in etchant waste bottles 24, 25. The waste diverter valve 15 dictates which waste bottle the etchant waste is collected in.

As the etch cavity grows larger, the bond wires in the sample 5 will become exposed. The bond wires are biased to the positive voltage of the power supply 1 through the electrical connection formed by the ram-nose 3, the metal backing plate 4, the leads or lead fingers of the package, to the package lead frame and onto the bond wires. The etchant mixture contains ions, so when the etchant mixture contacts the bond wires, an electrochemical cell is formed in the etch cavity between the adjustable power supply 1 and the etch head 7, which is grounded to the negative terminal 11 of the adjustable power supply 1. The positively-charged bond wires repel positively-charged ions in the etchant mixture and attract negatively-charged ions in the etchant mixture. As a result, an electrolysis process occurs in the electrochemical cell where the electrolysis process is exploited to protect the bond wires made of certain materials from etch damages, as will be explained in more detail below.

When the sample is fully etched, a rinse pumping cycle occurs for 0-20 seconds, then the pump 12, the etchant supply line 13, the etch cavity, and the etchant waste line 14 are cleared of etchant by a purge of low-pressure nitrogen (e.g. ~5 PSI) from the low-pressure regulator 18 through the low-pressure supply line 20. After the system is purged of etchant, the etch chamber can be opened, allowing the user to remove the sample 5 for manual cleaning and inspection.

The amount of time spent etching depends on the size of the sample and amount of encapsulant to be removed during etching. Parameters such as heat-up/cool-down time, etch time, etch temperature, etchant volume, rinse time, and etchant mixture ratio can be set by the user through the decapsulation system's programming control. The etch process can be managed by a multi-controller, which in turn manages the local controllers for the pump 12, the valve manifolds of the decapsulation system, and the heaters in the heat exchanger 10.

The decapsulation system and method of the present invention employs an applied voltage to bias the conductive bond wires of an electronic device under etch to a positive potential. The electrolysis process thus formed in the etch cavity has the beneficial effect of forming a protective coating on bond wires of certain materials, for example, copper bond wires. Therefore, the decapsulation system and method of the present invention may be advantageously applied to allow an electronic device using copper bond wires to be decapsulated without damages to the copper bond wires. In some cases, the electrolysis process thus formed in the etch cavity may have an adverse effect on bond wires of other materials, such as gold bond wires. In embodiments of the present invention, the decapsulation system and method is configured to selectively apply the bias voltage during the decapsulation process. Accordingly, the same decapsulation system and method may be readily used for electronic devices incorporating different bond wire materials. When applied voltage is not needed, the decapsulation system may turn off or disconnect the applied voltage to the device under etch. When applied voltage can be used to protect the bond wires, the decapsulation system applies the bias voltage as described above.

Figure 3:
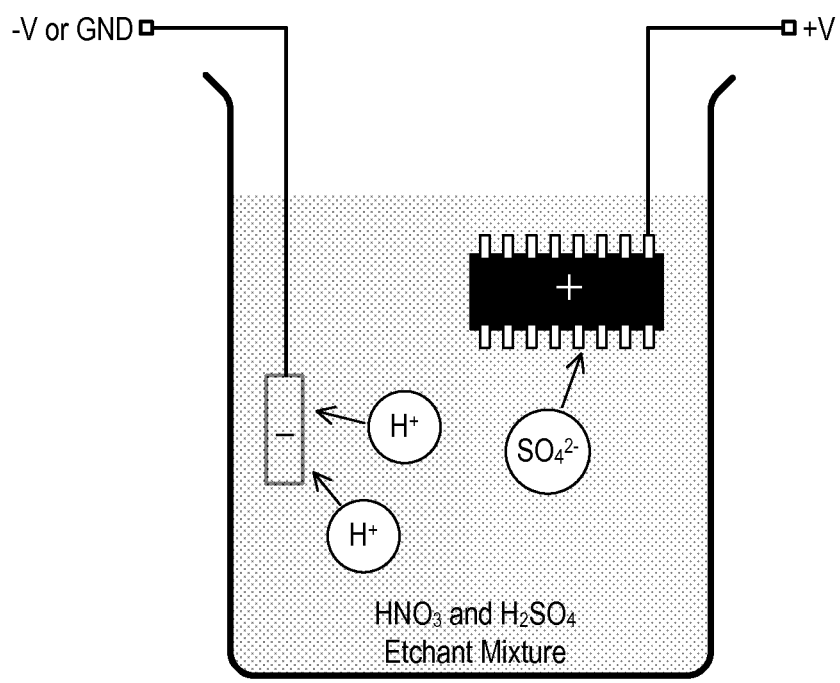
FIG. 3 is a diagram illustrating the electrochemical cell being formed in the etch cavity during the etching process as the result of the applied voltage of the decapsulation system.

FIG. 3 is a diagram illustrating the electrochemical cell being formed in the etch cavity during the etching process as the result of the applied voltage of the decapsulation system. FIG. 3 depicts the process in a beaker, but the principle is the same for use in the decapsulation system. In the present illustration, the etchant mixture is made of nitric acid ($HNO_3$) and sulfuric acid ($H_2SO_4$), anhydrous or fuming sulfuric acid. In the electrochemical cell, a positive voltage is applied to the bond wires of the sample under etch while the etchant mixture is biased to a negative voltage or the ground potential. Accordingly, the metal bond wires repel the acid ions ($H^+$) in the etchant solution so that the bond wires are not etched. Meanwhile, the acid ions are free to etch the neutral (not positive or negative charged) encapsulant of the sample. The side effect of this process is that the bond wires attract the negatively charged sulfate ions ($SO_4^{2-}$). The sulfate ions form a thin layer of copper sulfate onto the bond wires. This sulfate salt protects the bond wires and can later be removed by a manual rinse.

In the above described embodiments, the electronic device under etch is shown as a plastic dual in-line (PDIP) package with package leads extending from the plastic encapsulation. The metal backing plate is constructed as a sheet of metal to make electrical contact with the exposed lead of the PDIP package for applying the voltage to the bond wires. In other embodiments, the metal backing plate may be configured in other forms suitable for other plastic encapsulated package types, such as ball grid arrays (BGAs), plastic leaded chip carrier (PLCC), plastic quad flat pack (PQFP), small-outline integrated circuit (SOIC), and others. In embodiments of the present invention, the metal backing plate is configured as a conductive electrode for electrically contacting the leads of the device under etch, regardless of the package type.

The above detailed descriptions are provided to illustrate specific embodiments of the present invention and are not intended to be limiting. Numerous modifications and variations within the scope of the present invention are possible. For example, in the above-described decapsulation system, a metal backing plate, a ram nose are used to couple the applied voltage to the device under etch. The specific construction of the elements for coupling the applied voltage to the device under etch is not critical to the practice of the present invention and one of ordinary skill in the art would appreciate that other elements can be used to electrically couple an applied voltage to a device under etch in a decapsulation system. Also, in the above-described embodiments, an aperture-defining gasket is used to define the decapsulation aperture. The aperture-defining gasket is optional and may be omitted in other embodiments of the present invention.

Furthermore, in the above described embodiments, the adjustable power supply provides a positive bias voltage to the device under etch. In other embodiments, the adjustable power supply may provide a negative bias voltage to the device under etch. The use of a positive or a negative applied bias voltage may be determined based on the bond wire materials and the etchant chemistry being used. Furthermore, in embodiments of the present invention, the adjustable power supply 1 is configured to provide different voltage values for biasing the bond wires of the sample under etch. The voltage values may be selected based on the bond wire materials and the etchant chemistry being used.

Decapsulation System with Cooling System

According to embodiments of the present invention, a decapsulation system and method employs cooled etchant and an applied voltage to decapsulate a plastic encapsulated electronic device. In some embodiments, the cooled etchant or etchant mixture has a temperature below the ambient temperature of the decapsulation system and the applied voltage is used to bias the conductive bond wires of the electronic device under etch. In one embodiment, the decapsulation system incorporates an etchant cooling system using a thermoelectric cooler to cool the temperature of the etchant to a temperature below ambient. In the present description, the term "etchant" is used to refer to an etchant solution or a mixture of two or more etchant solutions ("an etchant mixture).

In embodiments of the present invention, the decapsulation system uses the etchant cooling system to cool the etchant mixture down to 10° C. to 15° C. Lowering the etchant mixture temperature to below the ambient temperature has the effect of reducing the etch rate and providing further protection of the bond wires of the integrated circuit, especially copper bond wires, from being etched or corroded during the decapsulation process.

Figure 4:
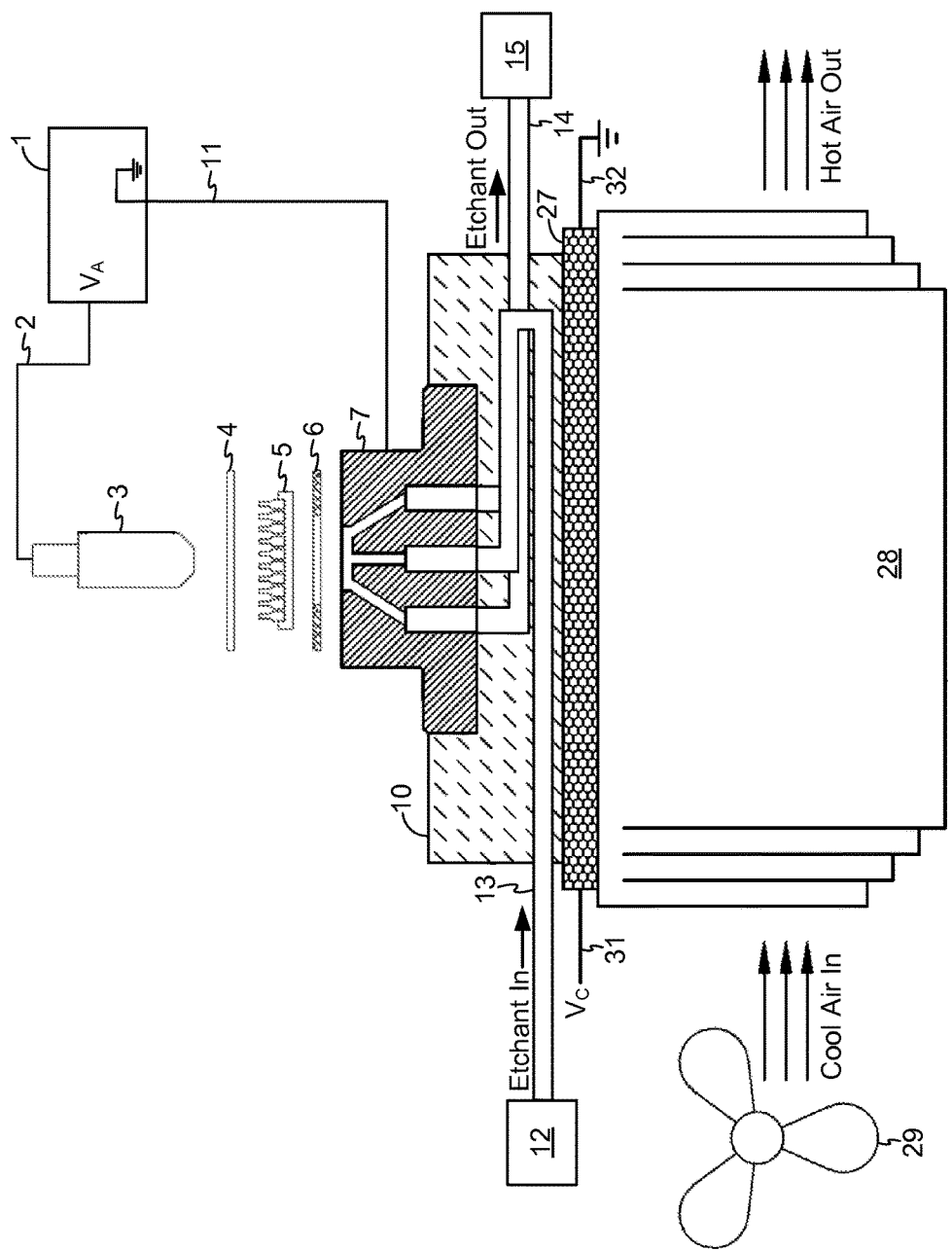
FIG. 4 is a schematic side view of the etch head portion of a decapsulation system with an etchant cooling system according to an alternate embodiment of the present invention.

In embodiments of the present invention, the etchant cooling system is incorporated in the decapsulation system of FIG. 1 to enable the use of an applied voltage as well as cooled etchant during the decapsulation process. FIG. 4 is a schematic side view of the etch head portion of a decapsulation system with a cooling system according to an alternate embodiment of the present invention. FIG. 4 illustrates the etch head portion of the decapsulation system incorporating the etchant cooling system. In the following description, the decapsulation system with an etchant cooling system will be described with reference to FIGS. 1 and 4 where like elements are given like reference numerals and will not be further described.

Referring to FIGS. 1 and 4, a micro-metering multi-port pump 12 draws an etchant mixture from etchant supply bottles 22, 23 and pumps the etchant mixture into an etchant supply line 13. As the etchant mixture is pumped through the etchant supply line 13, the etchant mixture travels through the spirally passageway in the core of a heat exchanger 10. The heat exchanger 10 adjusts the temperature of the etchant mixture to a desired etching temperature. In some embodiments, the heat exchanger 10 may also adjust the temperature of the etch head 7 and, through a gasket 6 that defines the decapsulation aperture, the plastic encapsulated electronic device 5 to be etched (henceforth referred to as the "sample") to the etching temperature. In embodiments of the present invention, the heat exchanger 10 is operated to heat the etchant mixture. That is, the heat exchanger 10 is operated to increase the etching temperature of the etchant mixture, such as to increase above the ambient temperature of the decapsulation system. Furthermore, the heat exchanger 10 may be operated to heat the etch head and at least the surface of the device under etch mounted on the etch head.

In embodiments of the present invention, the metal ram-nose 3 is supplied with a voltage $V_A$ from an adjustable power supply 1. More specifically, the metal ram-nose 3 is connected to a positive node 2 of the power supply 1. While etching, voltage $V_A$ travels through the ram-nose 3 to the metal backing plate 4 to the sample 5, which provides the bond wires of the device under etch 5 with a positive electrical bias. Meanwhile, the etch head 7 is connected through a wire to the negative terminal 11 of the adjustable power supply 1. The negative terminal of the power supply 1 can be connected to a negative voltage potential but is typically at ground. The etch head 7 is thus electrically biased to the ground potential. Accordingly, the etchant mixture is electrically biased to the ground potential as well. In the present embodiment, the etch head 7 is grounded to bias the etchant mixture to the ground potential. In other embodiments, other methods to apply ground potential to the etchant mixtures may be used, such as by use of a conductive electrode coated with a non-conductive material.

In embodiments of the present invention, the decapsulation system incorporates an etchant cooling system to cool the etchant mixture when an etching temperature below the ambient temperature is desired. In the present embodiment, the etchant cooling system includes a thermoelectric cooler 27 in contact with the heat exchanger 10. In particular, the thermoelectric cooler 27 is in contact with a surface of the heat exchanger 10 that is away from the etch head 7. In some embodiments, the etchant cooling system further includes a heat sink 28 with skiving fins and a fan 29 for providing air circulation. In one embodiment, the heat sink 28 is a copper heat sink.

The etchant cooling operation is as follows. When the etchant mixture in the spiral supply line 13 is to be cooled to a temperature below the ambient temperature, the thermoelectric cooler 27 is activated by an applied voltage $V_C$ to create a thermal difference between the heat exchanger 10 and the heat sink 28 which has the effect of cooling the heat exchanger 10 by moving heat from the heat exchanger 10 to the heat sink 28. The heat sink is provided with skiving fins to increase the surface area for heat dissipation. When cooling is desired, the fan 29 may be activated or may be controlled to increase in speed to blow excess air across the heat sink fins, removing heat and allowing the thermoelectric cooler 27 to further chill the heat exchanger 10 to the desired etching temperature below the ambient temperature. In some embodiments, the cooling system may be operated to cool the heat exchanger 10 which then operates to cool the etch head and at least the surface of the device under etch mounted on the etch head to a temperature below the ambient temperature.

As the etchant mixture is pumped through the heat exchanger 10 and the etch head 7, the etchant mixture contacts the sample 5 through the gasket 6 and etches a cavity in the encapsulant of the sample. The etched encapsulant and waste acid leave the etch chamber through an etchant waste line 14 and are collected in etchant waste bottles 24, 25. The waste diverter valve 15 dictates which waste bottle the etchant waste is collected in.

As the etch cavity grows larger, the bond wires in the sample 5 will become exposed. The bond wires are biased to the positive voltage of the power supply 1 through the electrical connection formed by the ram-nose 3, the metal backing plate 4, the leads or lead fingers of the package, to the package lead frame and onto the bond wires. The etchant mixture contains ions, so when the etchant mixture contacts the bond wires, an electrochemical cell is formed in the etch cavity between the adjustable power supply 1 and the etch head 7, which is grounded to the negative terminal 11 of the adjustable power supply 1. The positively-charged bond wires repel positively-charged ions in the etchant mixture and attract negatively-charged ions in the etchant mixture. As a result, an electrolysis process occurs in the electrochemical cell where the electrolysis process is exploited to protect the bond wires made of certain materials, such as copper, from etch damages.

When the sample is fully etched, a rinse pumping cycle occurs for 0-20 seconds, then the pump 12, the etchant supply line 13, the etch cavity, and the etchant waste line 14 are cleared of etchant by a purge of low-pressure nitrogen (e.g. ~5 PSI) from the low-pressure regulator 18 through the low-pressure supply line 20. After the system is purged of etchant, the etch chamber can be opened, allowing the user to remove the sample 5 for manual cleaning and inspection.

The etchant cooling system incorporated in the decapsulation system operates as follows. The thermoelectric cooler 27 transfers heat from one side of the cooler device to the other side, with consumption of electrical energy and as a function of the applied voltage, depending on the direction of the electrical current flowing through the cooler. The thermoelectric cooler 27 has a first terminal 31 receiving a first voltage, such as the applied voltage $V_C$, and a second terminal 32 receiving a second voltage, such as the ground voltage. When a positive voltage $V_C$ is applied to first terminal 31 relative to a ground voltage applied to the second terminal 32, an electrical current flows through the cooler device 27 from the first terminal to the second terminal and heat is drawn from one side of the device (the surface adjacent the heat exchanger 10) and moved to the other side of the device 27 (the surface adjacent the heat sink 28). The heat movement creates a thermal difference between the top and bottom surfaces of the thermoelectric cooler device.

As thus configured, the thermoelectric cooler 27 is sandwiched between the heat exchanger 10 and the heat sink 28. When electrical current is passed through the thermoelectric cooler 27 from the first terminal 31 to the second terminal 32, heat is drawn from the heat exchanger 10 and moved to the heat sink 28.

In the present embodiment, the heat sink 28 is formed with multiple skiving fins on the opposite side of the thermoelectric cooler 27 to increase the surface area for heat dissipation. The fan 29 blows air through the fins to facilitate heat dissipation. Because convection is more effective over larger surface areas, the fins help create a very large surface area for the air to move across, allowing for more efficient heat transfer by convection from the heat sink 28 to the exhausting environment. As the air cools the heat sink 28, the thermoelectric cooler 27 will maintain its thermal difference, and thus continue to draw heat from the heat exchanger 10 and move the heat to the air-cooled heat sink 28. The heat transfer operation causes the heat exchanger 10 to cool the etchant mixture as it travels through the spiral passageway of the supply line 13. The decapsulation system is thus provided with cooled etchant for the decapsulation operation.

In some embodiments, the thermoelectric cooler 27 is formed as a single thermoelectric cooler device. In other embodiments, the thermoelectric cooler 27 may be formed using multiple thermoelectric cooler devices connected in parallel.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An apparatus for selectively etching an encapsulant forming a package of resinous material around an electronic device comprising:

a source of etchant solution;

an etching assembly including an etch plate and a movable cover, the etch plate and the cover forming an etch chamber;

an etch head supported by the etch plate and electrically connected to a second voltage, wherein an electronic device package is mountable in the chamber on a top surface of the etch head;

a conductive electrode in electrical contact with package leads of the electronic device package to apply a first voltage to the package leads of the electronic device, wherein the first voltage is a positive voltage and the second voltage is a negative voltage or the ground potential;

a first pump configured to pump a first quantity of the etchant solution from the source into the etch head, the etchant solution being electrically biased to the second voltage by the etch head being electrically connected to the second voltage;

a heat exchanger in flow connection with the source of etchant solution and the etch head, the heat exchanger being configured to adjust the temperature of the etchant solution flowing through the heat exchanger to the etch head; and an etchant cooling system in contact with the heat exchanger, the etchant cooling system, when activated, adjusts the temperature of the etchant solution flowing through the heat exchanger to a temperature below the ambient temperature, wherein, in response to an electronic device package being mounted on the top surface of the etch head, the etch head is configured to form a seal between the electronic device package and the top surface of the etch head, and the first pump is configured to pump the first quantity of the etchant solution into the etch head and onto the top surface of the etch head to cause the etchant solution to contact the electronic device package mounted thereon, the etchant solution being cooled by the etchant cooling system, the cooled etchant solution reacting with the resinous material forming the package of the electronic device to form an etch cavity on the exterior surface of the electronic device package and exposing conductive bond wires of the electronic device where the conductive bond wires of the electronic device are prevented from being etched by the applied first voltage.

2. The apparatus of claim 1, further comprising a power supply providing the first voltage to the conductive electrode and the second voltage to the etch head, the first voltage being a positive voltage and the second voltage being a ground potential, the first voltage being selected based on the material of the bone wire used in the electronic device package and the etchant solution being used.

3. The apparatus of claim 1, wherein the conductive electrode comprises a metal backing plate and the apparatus further comprises a conductive ram-nose configured to press down on the metal backing plate when the cover engages the etch plate to form the etch chamber, and the metal backing plate in turn engages the electronic device package to form a seal between the encapsulant of the electronic device and the etch head.

4. The apparatus of claim 3, wherein the first voltage is applied to the package leads of the electronic device package through the ram-nose and through the metal backing plate.

5. The apparatus of claim 3, further comprising a gasket positioned on the etch head to define a decapsulation aperture, the electronic device package being mountable on the gasket.

6. The apparatus of claim 1, wherein the conductive bond wires comprises copper bond wires.

7. The apparatus of claim 1, wherein the heat exchanger is further configured to adjust the temperature of the etch head and at least the surface of the electronic device package mounted on the etch head.

8. The apparatus of claim 7, wherein the etchant cooling system is configured to adjust the temperature of the heat exchanger to a temperature below the ambient temperature, thereby adjusting the temperature of the etchant solution flowing through the heat exchanger to a temperature below the ambient temperature, and further adjusting the temperature of the etch head and at least the surface of the electronic device package mounted on the etch head to a temperature below the ambient temperature.

9. The apparatus of claim 1, wherein the etchant cooling system is configured to adjust the temperature of the heat exchanger to a below the ambient temperature, thereby adjusting the temperature of the etchant solution flowing through the heat exchanger to a temperature below the ambient temperature.

10. The apparatus of claim 1, wherein the etchant cooling system comprises:
a thermoelectric cooler device having a first surface in contact with the heat exchanger and a second surface, the thermoelectric cooler device being configured to receive a third voltage and to transfer heat from the first surface to the second surface as a function of the third voltage; and
a heat sink couple to the second surface of the thermoelectric cooler device, the heat sink dissipating heat from the second surface of the thermoelectric cooler device.

11. The apparatus of claim 10, wherein the heat sink comprises skiving fins and the etchant cooling system further comprises:
a fan providing air circulation to blow air across the fins of the heat sink.

* * * * *